(12) United States Patent
Ohkubo et al.

(10) Patent No.: US 6,666,031 B2
(45) Date of Patent: Dec. 23, 2003

(54) FLUID TEMPERATURE CONTROL APPARATUS

(75) Inventors: Hideaki Ohkubo, Hiratsuka (JP); Kazuhiko Kubota, Hiratsuka (JP)

(73) Assignee: Komatsu, Ltd., Tokyo (JP)

( * ) Notice: Subject to any disclaimer, the term of this patent is extended or adjusted under 35 U.S.C. 154(b) by 0 days.

(21) Appl. No.: 10/378,887

(22) Filed: Mar. 5, 2003

(65) Prior Publication Data
US 2003/0172657 A1 Sep. 18, 2003

(30) Foreign Application Priority Data
Mar. 14, 2002 (JP) .................................... 2002-069561

(51) Int. Cl.[7] .............................................. F25B 21/02
(52) U.S. Cl. .......................................... 62/3.3; 62/3.7
(58) Field of Search .......................... 62/3.2, 3.3, 3.7, 62/430

(56) References Cited
U.S. PATENT DOCUMENTS 5,865,031 A * 2/1999 Itakura ........................ 62/3.7
6,345,506 B1 * 2/2002 Kontani et al. ............. 62/3.2
2001/0013224 A1 * 8/2001 Ohkubo et al. ............. 62/3.7

FOREIGN PATENT DOCUMENTS
JP 11067717 3/1999

\* cited by examiner

Primary Examiner—Melvin Jones
(74) Attorney, Agent, or Firm—Stevens, Davis, Miller & Mosher, LLP

(57) ABSTRACT

A fluid temperature control apparatus performing precise control of the temperature, in which a high sealing performance in a heat transfer chamber is maintained even under a situation of repetitive thermal cycle accompanying the cooling and heating. The fluid temperature control apparatus includes a heat transfer block formed with an inflow port, an outflow port and a concave portion; a heat transfer plate which constitutes the heat transfer chamber by covering the concave portion of the heat transfer block; a holding unit for holding the heat transfer block and the heat transfer plate by using an elastic member so as to prevent plastic deformation of the heat transfer block by means of expansion or contraction of the elastic member following thermal expansion or thermal contraction of the heat transfer block; and temperature controlling unit for performing heat exchange with the fluid via the heat transfer plate.

9 Claims, 8 Drawing Sheets

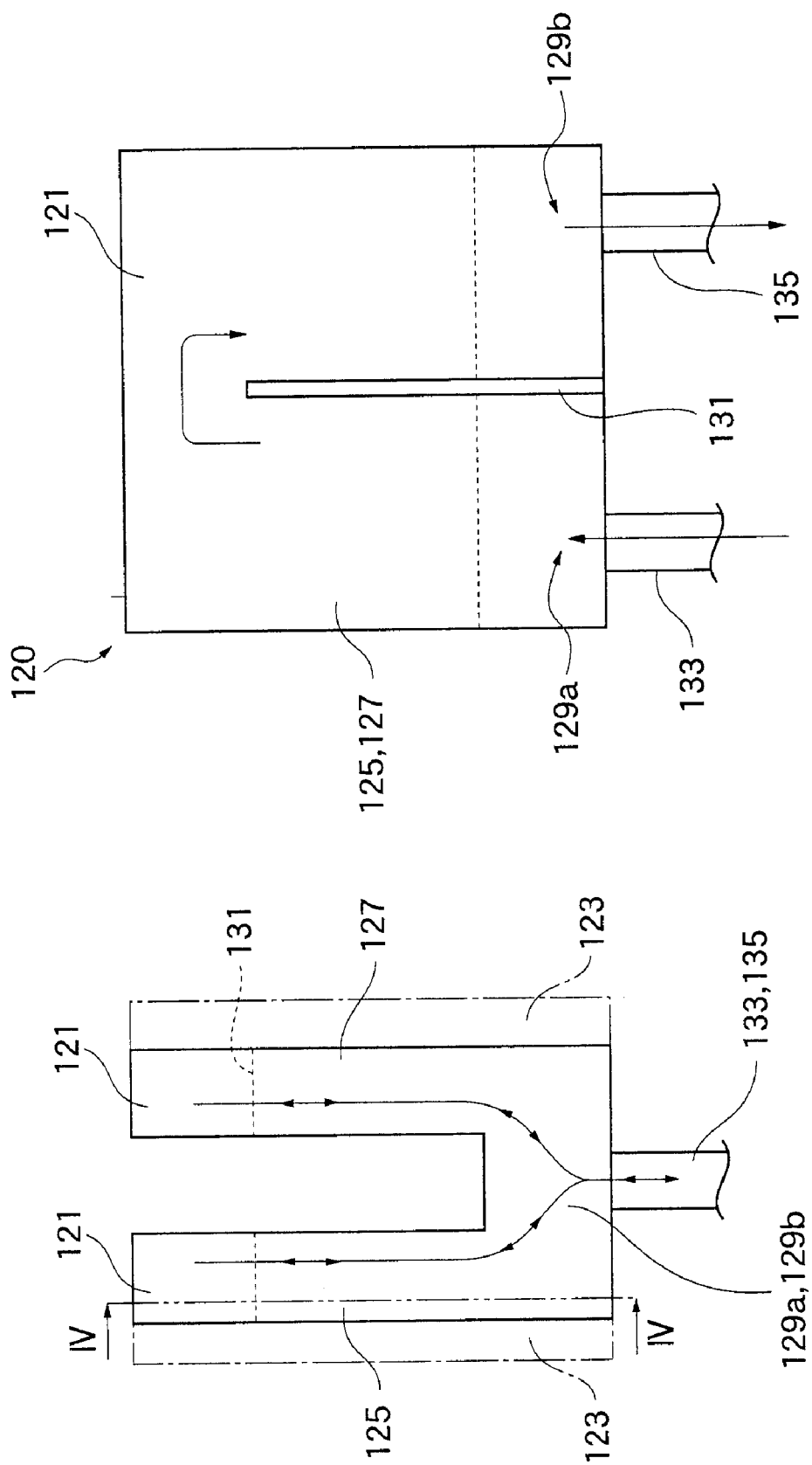

FLUID TEMPERATURE CONTROL APPARATUS

BACKGROUND OF THE INVENTION

1. Field of the Invention

The present invention generally relates to a fluid temperature control apparatus, particularly to a fluid temperature control apparatus suitable for performing precise control of the temperature of corrosive fluid used as processing solution in semiconductor manufacturing apparatus or the like.

2. Description of a Related Art

In the processing of semiconductor such as etching, cleaning, resist peeling or the like, generally, highly pure and highly corrosive chemical fluids are used. Reaction speed of these chemical fluids highly depends on the temperature thereof. In order to precisely control the reaction of a chemical liquid, it is necessary to control the temperature of the chemical fluid with high accuracy within, for example, a range from 15° C. to 85° C. Various temperature control apparatus are used for such temperature control.

FIG. 8 is a schematic plan view showing a structure of a conventional fluid temperature control apparatus.

The fluid temperature control apparatus 100 has a heat transfer chamber 101 formed in a block made of a corrosion resistant material such as fluorocarbon series resin or the like. Heat is transferred from a temperature control apparatus such as a thermoelectric element module or the like to the fluid passing through within the heat transfer chamber 101. The inside of the heat transfer chamber 101 is divided into four partitions 105 in the depth direction by three flow path forming plates 103. In one end of each flow path forming plate 103, opening 107 is formed. The openings 107 are disposed alternately in the ends of the three flow path forming plates 103. Owing to such constitution, the respective partitions 105 are linked to each other via the openings 107 to form a flow path which meanders within the heat transfer chamber.

To the two partitions 105 at the top and bottom in the heat transfer chamber 101, pipes are connected which are linked to these partitions 105, respectively. One of the pipes is a fluid intake pipe 109 and the other thereof is a fluid outlet pipe 111. The respective pipes are connected to the respective partitions at the position far from the openings 107 of the flow path forming plate 103. The fluid, which enters into the heat transfer chamber 101 from the fluid intake pipe 109, is subjected to heat release or heat absorption by the temperature control apparatus while meandering within the heat transfer chamber, and the temperature thereof is controlled. Then, the temperature-controlled fluid is supplied to the next process through the fluid outlet pipe 111. Detailed information about the fluid temperature control apparatus as shown in FIG. 8 is disclosed in Japanese patent application publication JP-A-11-67717.

FIGS. 9A and 9B are schematic views of a structure of another conventional fluid temperature control apparatus. FIG. 9A is a side view thereof, and FIG. 9B is a sectional view taken along a line IV—IV in FIG. 9A. The fluid temperature control apparatus 120 has a heat transfer chamber 121 as shown in FIG. 9A. On the top and bottom surfaces of the heat transfer chamber 121, heat transfer plates 123 are attached respectively. The heat transfer plates 123 is connected with a temperature control apparatus such as thermoelectric element module and performs heat release or heat absorption on the heat transfer chamber 121 under the control of the temperature control apparatus. Further, the heat transfer chamber 121 has an upper partition 125 and a lower partition 127 of the heat transfer chamber with holes 129a and 129b that links both partitions to each other. As shown in FIG. 9B, each of the upper partition 125 and the lower partition 127 is divided into two portions by a partitioning wall 131. To the side surfaces of the heat transfer chamber 121 where the holes 129a and 129b are formed, a fluid intake pipe 133 and a fluid outlet pipe 135 are connected, respectively.

The fluid entered into the hole 129a via the fluid intake pipe 133 is divided in the partitions and branched into the upper partition 125 and the lower partition 127, and flows so as to make a U-turn along the partitioning wall 131 in the respective partitions. During this, the temperature thereof is controlled by the thermoelectric element module or the like. And then, the fluids congregate at the hole 129b to flow out from the fluid outlet pipe 135 to the next process.

In the fluid temperature control apparatus as described above, in order to precisely control the temperature of the fluid, it is necessary that the fluid comes into contact with the thermoelectric element evenly while flowing in the flow path. Accordingly, it is necessary to form the flow path so as to reduce as few as possible such portions where the flow of the fluid becomes irregular, for example, where swirl of the fluid is generated in the heat transfer chamber or where the speed of flow gets slow to cause a stagnation. Further, when chemical fluid is removed from the apparatus after operation, in order to prevent the chemical fluid to be used next time from being contaminated thereby, it is necessary to completely empty the apparatus so as to leave no chemical fluid therein. Furthermore, it is preferred to adapt the depth in the heat transfer chamber to be very shallow so that the fluid is subjected effectively to the heat transfer.

However, in the conventional example as shown in FIG. 8, since the capacity of the heat transfer chamber 101 is large and the heat transfer chamber 101 is deep, there is a possibility that the performance to transfer the heat to the entire fluid becomes not even. Further, the flow path forming plates 103 are attached to the side surface of the heat transfer chamber 101 and inserted into the grooves formed therein. Due to this, a gap may be generated between the groove and the plate 103 allowing the chemical fluid to enter therein. Thus, a solid may crystallize out there from the chemical fluid. Still further, since the flow path has a meandering configuration as described above, the chemical fluid is apt to be left at the corners of the respective partitions 105 when the chemical fluid is drained.

Still furthermore, in the conventional embodiment as shown in FIGS. 9A and 9B, in the flow path constituted of the upper partition 125 and the lower partition 127, the flow speed of the fluid near the partitioning wall 131 is different from that at the outer side thereof, and the fluid may stagnate at the corners of the respective flow paths.

Accordingly, it is necessary to form the flow path so as not to form a cornered portion or extremely narrow portion. Further, in the case where the flow path has a certain depth, the effect of the temperature controlling member may not reach to the central region of the fluid failing in even temperature control. Accordingly, a fluid temperature control apparatus is required in which the layer of the fluid is made to be as thin as possible to increase the amount of the fluid that comes into contact with the temperature controlling member and which is provided with a flow path generating no swirl nor stagnation. Furthermore, it is more preferred if the chemical fluid can be removed completely.

On the other hand, another problem remains as described below in the conventional fluid temperature control apparatus. Generally, the heat transfer chamber is made by carving a block-like material (heat transfer block) to form concave portions and covering the concave portions with high heat conductive plates. To the plates, thermoelectric element modules for performing the temperature control come into contact therewith, and via the plates, heat exchange is performed between the fluid in the heat transfer chambers and the thermoelectric element modules. The contact points between the heat transfer block and the high heat-conductive plates are made to come into tight contact with each other by means of a sealing member such as an O-ring, and thereby the fluid is prevented from leaking from the heat transfer chamber formed by the both.

The heat transfer block is made of a material such as fluorocarbon series resin which is excellent in corrosion resistance. Generally, such material as described above has a large coefficient of linear expansion (for example, approximately ten times as large as that of iron), and is apt to suffer plastic deformation. Accordingly, such problem remains that, when heating and cooling of the heat transfer block are repeated, a dimensional reduction is caused in the pressure welding direction, contact pressure at the sealing portions between the heat transfer block and the high heat-conductive plates lowers resulting in a gap, and therefore, the fluid in the heat transfer chamber leaks therefrom.

In order to solve the problems as described above, FIG. 5 of JP-A-11-67717 shows that the heat transfer block and the heat exchanger plates are fixed by using bolts and conical springs. That is to say, by selecting the number of conical springs or overlapping direction thereof, compression force of the entire conical springs is increased, or the extension and compaction of the conical springs are increased to largely absorb the dimensional reduction due to the plastic deformation.

However, in these days, the temperature controllable range required for the fluid temperature control apparatus has been getting larger and larger. Since the amount of plastic deformation of the heat transfer block is getting larger, there may be a case where the mechanism as describe above cannot absorb the amount of deformation sufficiently, or a case where the durability of the apparatus itself is affected by repeating such deformation as described above.

SUMMARY OF THE INVENTION

The present invention has been achieved in view of the above-described problems. A first object of the present invention is to provide a fluid temperature control apparatus capable of performing precise control of the temperature, in which a high sealing performance in a heat transfer chamber is maintained even under a situation of repetitive thermal cycle accompanying the cooling and heating. Further, a second object of the present invention is to provide a fluid temperature control apparatus in which the chemical fluid hardly remains in the heat transfer chamber when the chemical fluid is drained therefrom.

In order to solve the above-described problems, a fluid temperature control apparatus according to the present invention comprises a block member formed with at least one inflow port and at least one outflow port for fluid, and concave portion which constitutes a part of a heat transfer chamber for controlling temperature of the fluid by allowing the fluid to pass therethrough; a heat transfer plate which constitutes the heat transfer chamber by covering the concave portion of the block member; holding means for holding the block member and the heat transfer plate such that the contact portions thereof come into tight contact with each other, the holding means holding the block member and the heat transfer plate by using an elastic member so as to prevent plastic deformation of the block member by means of expansion and contraction of the elastic member following thermal expansion and thermal contraction of the block member respectively; and temperature controlling means for performing heat exchange with the fluid, which passes through the heat transfer chamber, via the heat transfer plate.

According to the present invention, the block member and the heat transfer plate are held being compressed by using holding means including an elastic member. Therefore, even when a thermal deformation is generated in the block member, an amount of the thermal deformation is absorbed by the elastic member, thereby plastic deformation is prevented from being generated on the block member while maintaining the sealing performance between the block member and the heat transfer plates.

BRIEF DESCRIPTION OF THE DRAWINGS

FIGS. 9A and 9B are views schematically showing a structure of another conventional fluid temperature control apparatus in which FIG. 9A is a side view thereof and FIG. 9B is a sectional view taken along a line IV—IV in FIG. 9A.

DESCRIPTION OF THE PREFERRED EMBODIMENTS

Figure 1:
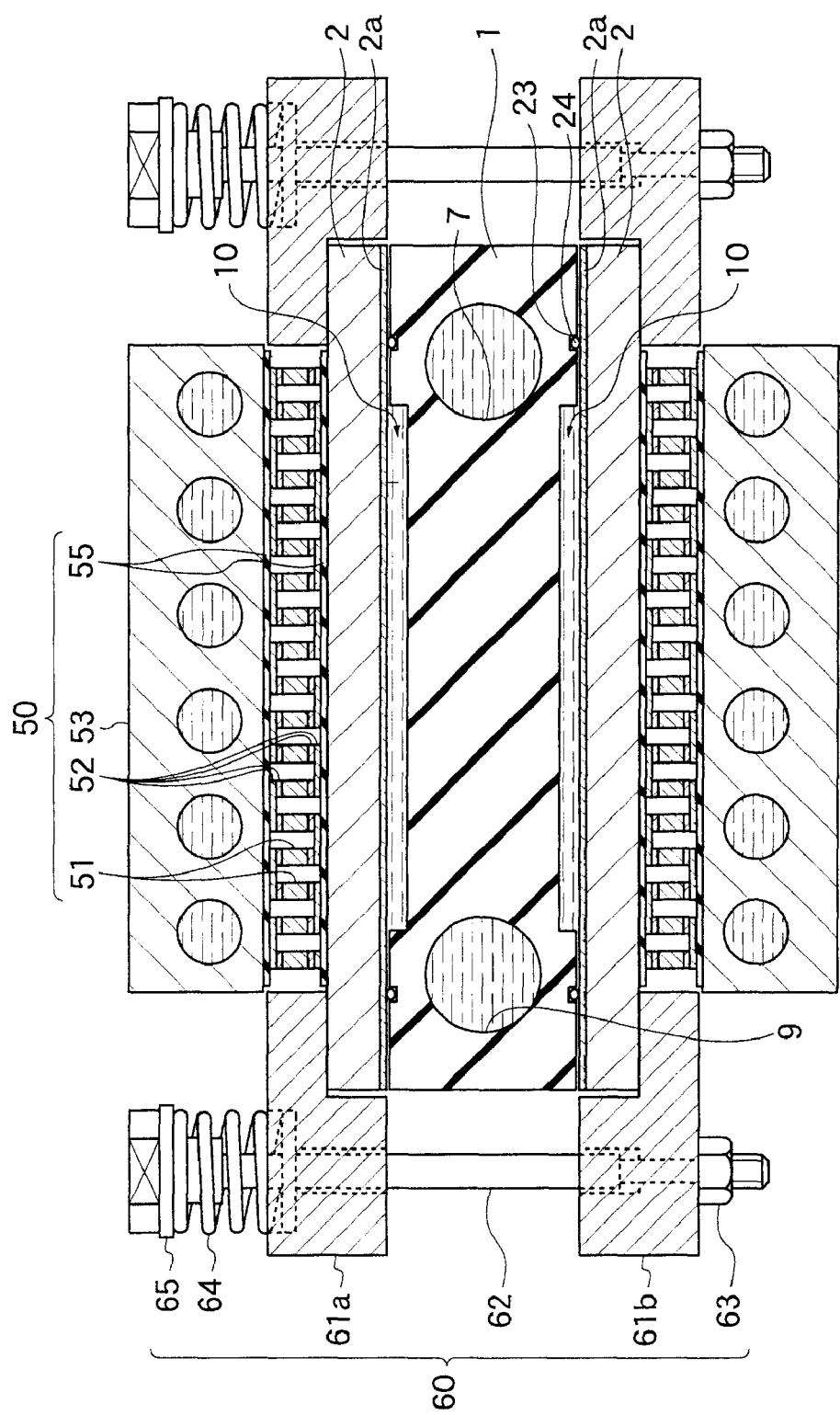
FIG. 1 is a sectional view showing a structure of a fluid temperature control apparatus according to a first embodiment of the present invention.

Now, referring to the drawings, embodiments of the present invention will be described in detail. The same components will be given with the same reference numerals and the descriptions thereof will be omitted.

FIG. 1 is a sectional view showing a structure of a fluid temperature control apparatus according to a first embodiment of the present invention. The fluid temperature control apparatus comprises a heat transfer block 1, two pieces of heat transfer plates 2 disposed at the both sides of the heat transfer block 1, holding units 60 for holding the heat transfer block 1 and the heat transfer plates 2 by compressing both of them such that the contact points thereof come into tight contact with each other, and temperature controlling units 50 disposed so as to come into contact with the two pieces of heat transfer plates 2 respectively.

Formed between the heat transfer block 1 and the heat transfer plates 2 are heat transfer chambers 10. The heat transfer chambers 10 are the regions for performing temperature control of fluid by allowing the fluid to pass through the chambers while applying heat thereto or absorbing heat therefrom. The heat transfer block 1 is made by carving a block of corrosion resistant material to form regions (concave portions) to be heat transfer chambers 10, an inflow port 7 and an outflow port 9 for the fluid. As for the corrosion resistant material, for example, a fluorocarbon series resin such as Teflon (registered trademark) is used. The configuration of the heat transfer block 1 and the flow path of the fluid will be described in detail later.

The heat transfer plates 2 are disposed so as to cover the concave portions formed on the heat transfer block 1, respectively. The heat transfer plates 2 are made of a material having high thermal conductivity such as aluminum. Also, a region of a surface of the heat transfer plate 2 contacting the fluid is adhered with, for example, amorphous carbon film 2a having a thickness of 0.5 mm. The amorphous carbon has thermal conductivity and corrosion resistance and prevents the heat transfer plates 2 from being corroded by the fluid.

Around the concave portions formed on the heat transfer block 1, grooves 23 are formed and sealing members 24 such as O-ring are fitted thereinto, respectively. By compressing the above-described heat transfer block 1 and the heat transfer plates 2 by means of the holding units 60, fluid-tightness of the heat transfer chamber 10 formed by the heat transfer block 1 and the heat transfer plate 2 is maintained.

The holding units 60 holds the heat transfer block 1 and the heat transfer plates 2 disposed at the both sides thereof such that the contact points thereof come into tight contact with each other. A holding unit 60 comprises two frames 61a and 61b, bolts 62, nuts 63, coil springs 64, and a spring retainers (collars) 65. The two frames 61a and 61b sandwich the heat transfer block 1 and the heat transfer plates 2 disposed at the both sides thereof between them. The bolt 62 fastens these frames 61a and 61b along with the nut 63 and the coil spring 64. The coil spring 64 serves as an elastic member in combination with the bolt 62.

The reason why the coil spring 64 is used for fastening the two frames 61a and 61b is as described below.

In the fluid temperature control apparatus according to the first embodiment, the heat transfer chamber 10 is made out of a block of fluorocarbon series resin such as Teflon (registered trademark). Generally, fluorocarbon series resin as described above has a high coefficient of linear expansion (for example, ten times as high as the coefficient of iron). Accordingly, when the control temperature of the fluid is changed, for example, from an ambient temperature (20° C.) to a high temperature (100° C.), the heat transfer block 1 undergoes a large thermal deformation. When the heat transfer block 1 and the heat transfer plate 2 are fixed tightly at that time, the heat transfer block 1 suffers a plastic deformation. After that, even when the heat transfer block 1 is cooled down, the configuration which has suffered the plastic deformation does not recover the original configuration, and a gap is generated between the heat transfer block 1 and the heat transfer plate 2.

Therefore, in the first embodiment, the heat transfer block 1 and the heat transfer plate 2 are held by using an elastic force of the coil spring 64 without fixing the both tightly. Owing to this, when the heat transfer block 1 undergoes thermal deformation, it is possible for the heat transfer plate 2 to shift following the deformation. That is to say, when the heat transfer block 1 undergoes a thermal expansion, the coil spring 64 is compressed, and the amount of expansion is absorbed by the spring. Accordingly, since excess thermal stress is not applied to the heat transfer block 1, the plastic deformation of the heat transfer block 1 can be prevented. On the other hand, when the heat transfer block 1 is cooled down and contracted, since the coil spring 64 extends in accordance with the amount of contraction, the heat transfer block 1 and the heat transfer plate 2 can be held with the sealed portion thereof being kept in a tight contact with each other. As described above, by holding the heat transfer block 1 and the heat transfer plate 2 by using an elastic force, the heat transfer block 1 is prevented from suffering plastic deformation and a dimensional reduction due to the stress, while maintaining the liquid-tightness therebetween.

Herein, it is preferred to select the material, the configuration and so on of the coil spring 64 such that the compressing force between the heat transfer block 1 and the heat transfer plate 2 changes little all over the deformation range of the heat transfer block 1 while taking into consideration the controllable temperature range in the temperature control apparatus according to the first embodiment, the coefficient of thermal expansion of the heat transfer block 1 and so on. Owing to this, it is possible to absorb an amount of deformation of the heat transfer block 1 without applying excess thermal stress to the heat transfer block 1 while maintaining the tight contact of the sealed portion between the heat transfer block 1 and the heat transfer plate 2. Particularly, in the initial stage, it is preferred to fasten the frame 61a and the frame 61b in the state that the coil spring 64 is compressed to a certain level at ambient temperatures.

In the first embodiment, a coil spring 64 having a relatively small spring constant is used as the elastic member in order to absorb the thermal deformation of the heat transfer block 1 sensitively. However, if elasticity capable of absorbing the thermal deformation of the heat transfer block 1 is obtained, any elastic member may be used not limited to the coil spring. For example, a conical spring, a leaf spring or the like may be used.

Outside of the two heat transfer plates 2, the temperature controlling units 50 are provided, respectively. The temperature controlling unit 50 is the device that performs temperature control of the fluid within the heat transfer chamber 10 via the heat transfer plate 2. As for the temperature controlling unit 50, a heating device or a cooling device capable of controlling temperature such as a common heater, thermoelectric module using plural thermoelectric elements may be used. In the first embodiment, the temperature controlling unit 50 comprises plural thermoelectric elements 51 formed with electrodes 52 at both ends thereof, and a heat exchanging plate 53 respectively. The plural thermoelectric elements 51 formed with the electrodes 52 are connected to the heat transfer plate 2 and the heat exchanging plate 53 via insulation layers 55, and are held being sandwiched thereby. The heat exchanging plate 53 is for cooling or heating the thermoelectric elements 51 and, for example, a plate of a water-recycle type is used. When electric current is applied to the plural thermoelectric elements 51, heat is absorbed or emitted owing to the thermoelectric effect thereof. As for the detailed information about the above-described thermoelectric module, contents of Japanese Patent Laid-open Publications JP-A-3-225973 and JP-A-10-178218 are incorporated herein by reference.

Figure 2:
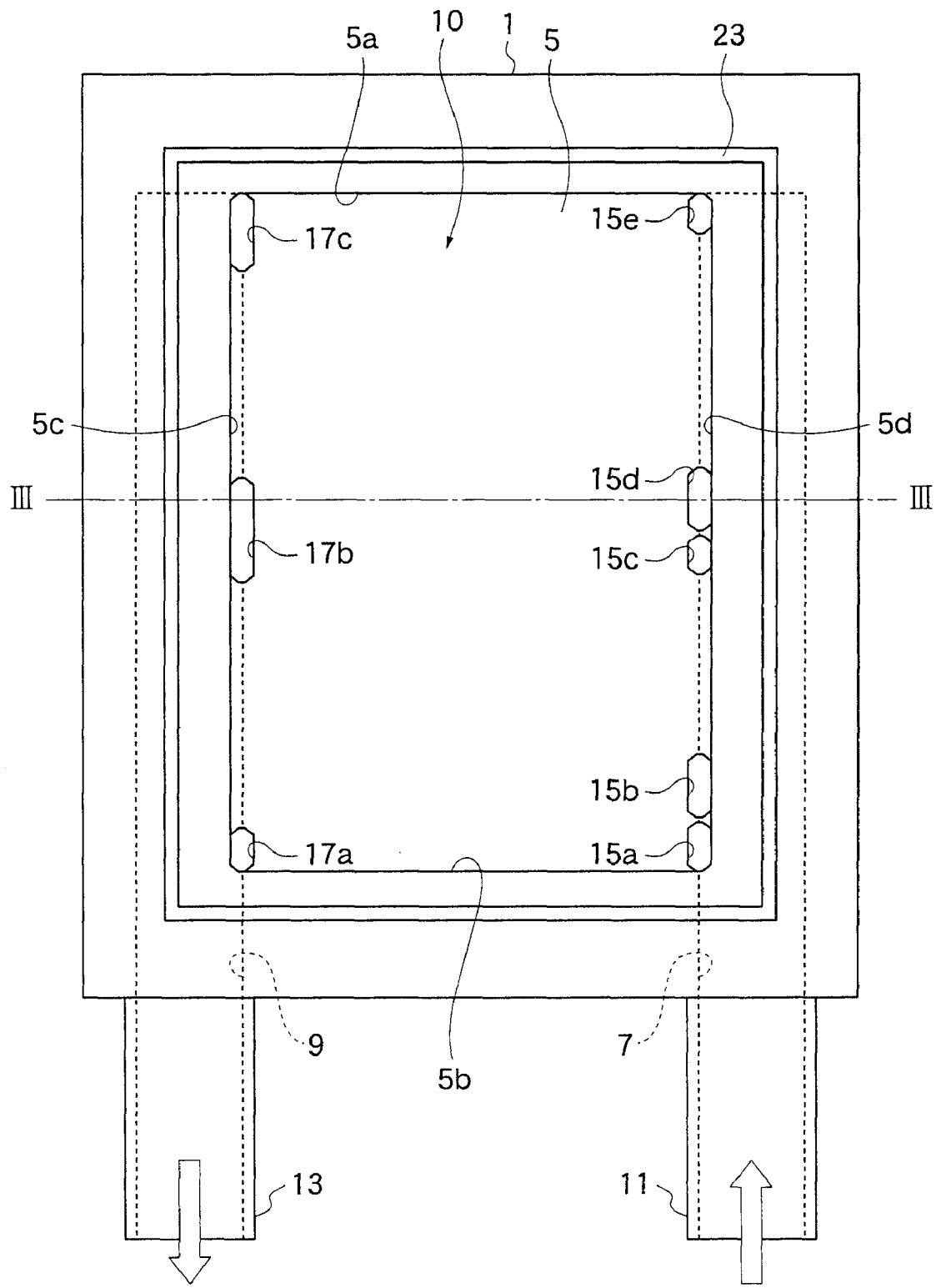
FIG. 2 is a plan view showing a structure of a heat transfer chamber of the fluid temperature control apparatus as shown in FIG. 1.
Figure 3:
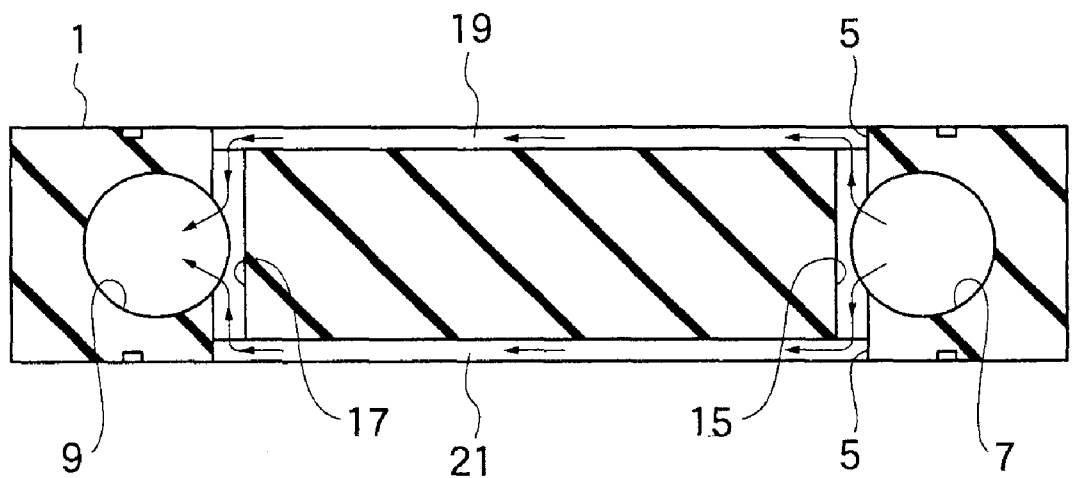
FIG. 3 is a front sectional view of the heat transfer chamber in FIG. 2.

Next, referring to FIGS. 2 and 3, the structure of the heat transfer block 1 will be described in detail. FIG. 2 is a plan view showing the heat transfer block 1 in FIG. 1, and FIG.

3 is a sectional view of the heat transfer block 1 in FIG. 2 taken along a line III—III.

As shown in FIG. 2, a concave portion 5 is formed by carving the surface of the heat transfer block 1 in rectangular solid made of a corrosion resistant material such as fluorocarbon series resin. The dimension of the heat transfer block 1 is, for example, 151 mm in length, 181 mm in width and 31 mm in thickness. In the same position on the upper surface and the lower surface of the heat transfer block 1, the concave portions 5 of the same size are formed respectively. The plan configuration of the concave portion 5 is rectangle extending in the longitudinal direction of the heat transfer block 1. The opposite two side surfaces 5a and 5b of the concave portion 5 are parallel to each other, the opposite two side surfaces 5c and 5d are also parallel to each other and the bottom surface is flat. The dimension of the concave portion 5 is, for example, 106 mm in length, 141 mm in width and 4 mm in depth.

At the both sides of the heat transfer block 1, two holes 7 and 9 extending parallel in the longitudinal direction of the heat transfer block 1 are formed. As shown in FIG. 3, the center lines of these holes 7 and 9 are positioned at the center in the thickness direction of the heat transfer block 1. The distance between the periphery of the hole 7 and the periphery of the hole 9 is adapted so as to be shorter than the length of the side surfaces 5a and 5b of the concave portion 5. The holes 7 and 9 have a length extending from one external surface of the heat transfer block 1 to the side surface 5a of the concave portion 5. For example, the diameter of the holes 7 and 9 is 15.8 mm and the length thereof is 160 mm. Herein, one hole 7 (right side in the figure) is used as an intake flow path and the other hole 9 (left side in the figure) is used as an outlet flow path. To the intake flow path 7, a pipe 11 extending from a fluid source is connected, and to the outlet flow path 9, a pipe 13 extending to the next section is connected. Hereinafter, it is assumed that, in the heat transfer block 1, the side where the pipes 11 and 13 are connected is the near side, and the opposite side is the back side.

In the heat transfer block 1, plural inflow ports 15a–15e, which are bored therethrough in the thickness direction, are formed along the side surface 5d on the right side of the concave portion 5. Also, plural outlet ports 17a–17e, which are bored therethrough in the thickness direction, are formed along the side surface 5c on the left side of the concave portion 5. The inflow ports 15a–15e are linked to the intake flow path 7 and the concave portions 5 on the upper and lower faces, while the outflow ports 17a–17c are linked to the outlet flow path 9 and the concave portions 5 on the upper and lower faces. Accordingly, the intake flow path 7 is linked to the concave portions 5 on the upper and lower faces via the inflow ports 15a–15e, and the outlet flow path 9 is linked to the concave portions 5 via the outflow ports 17a–17c. As a result, a flow path extending from the intake flow path 7 to the outlet flow path 9 is formed via the inflow ports 15a–15e, the concave portions 5 and the outflow ports 17a–17c.

Total five inflow ports 15a–15e are formed in three regions along the side surface 5d of the concave portion 5, that is, a pair of two ports (15a, 15b) which are disposed at the near side, a pair of two ports (15c, 15d) which are disposed in the central region, and a port (15e) which is disposed at the back side. The inflow port 15a at the near side and the inflow port 15e at the back side are located at the corners of the concave portion 5. The area of the three regions formed with the inflow ports becomes smaller from the near side toward the back side.

Also, total three outflow ports 17a–17c are formed in three regions along the side surface 5c of the concave portion 5, that is, one (17a) at the near side, one (17b) at the back side, and one (17c) at the central region are disposed. The outflow port 17a at the near side and the outflow port 17c at the back side are positioned at the corners of the concave portion 5. The area of the three regions formed with the outflow ports 17a–17c becomes smaller from the center, the back side to the near side in this order.

Next, referring to FIGS. 1–3, the state of flow of the fluid in the heat transfer block 1 will be explained. In the actual use, as shown in FIG. 1, the heat transfer plates 2 adhered with the amorphous carbon film 2a are disposed to the upper and lower surfaces of the heat transfer block 1, and cavities (heat transfer chambers 10 shown in FIG. 1 and FIG. 2) are formed between the respective concave portions 5 and the heat transfer plates 2. The cavities serve as the flow paths for the fluid of which temperature is to be controlled. The cavity formed in the upper concave portion is designated as an upper flow path 19, and the cavity formed in the lower concave portion 5 is designated as a lower flow path 21.

When the fluid supplied via the pipe 11 is guided into the intake flow path 7 of the heat transfer block 1, the fluid flows in the longitudinal direction in the intake flow path 7 and, at the same time, branches into upper and lower directions through the inflow ports 15a–15e. The branched fluid reaches the upper and lower surfaces of the heat transfer block 1 through the inflow ports 15a–15e, and flows into the upper flow path 19 and the lower flow path 21. In each of the upper flow path 19 and the lower flow path 21, the fluid, which flows out of the plural inflow ports 15a–15e, converges into one flow. In these flow paths, heat release or heat absorption by the temperature control unit 50 (see FIG. 1) is transferred to the fluid via the heat transfer plates 2 so that the temperature of the fluid is controlled. Then, the fluid of which temperature has been controlled flows in the direction of the outflow ports 17a–17c in each flow path 19, 21, enters into the outflow ports 17a–17c and converges in the outlet flow path 9. After that, the fluid flows toward the near side in the outlet flow path 9 and is guided to the next section through the pipe 13.

As described above, in the upper flow path 19 formed between the concave portion 5 in the upper face of the heat transfer block 1 and the heat transfer plates 2 and in the lower flow path 21 formed between the concave portion 5 in the lower face of the heat transfer block 1 and the heat transfer plates 2, the fluid flows from the side surface 5d of the concave portions 5 toward the side surface 5c opposite thereto. Since these side surfaces 5c and 5d are parallel to each other, speed of flow and flow rate per unit area of the fluid becomes substantially uniform. Further, since the depth of the flow path is shallow as 4 mm and the capacity of the fluid in the flow path is small in the depth direction, the area of the region in the flow path where the fluid comes into contact with the heat transfer plates 2 becomes larger. Accordingly, compared to the volume of the fluid, the ratio of the fluid that substantially contributes to the heat transfer becomes larger and the heat is transferred easily in the depth direction of the flow path. Thus, the performance of heat transfer is increased.

Further, since the inflow ports and the outflow ports are provided also at the corners of the concave portions 5, there is no curved or cornered portion in the flow path. Accordingly, the fluid is allowed to flow smoothly without stagnating or swirling. Furthermore, it is not necessary to provide any partitioning walls or the like for forming the flow path. Since the apparatus can be made only by carving the block and drilling holes through the block, laborious steps and cost necessary for manufacturing the apparatus can be reduced.

Still further, by adapting the opening areas of the plural inflow ports and outflow ports to be different from each other as described above, a flow of smoother and constant flow speed can be achieved. In the inflow ports, it is adapted so that the opening areas become smaller from the near side toward the back side. The reason is that the fluid guided into the intake flow path 7 has inertia of flow in the longitudinal direction of the intake flow path 7, and therefore, the fluid is apt to enter into the inflow ports at the back side and less apt to enter into the inflow ports at the nearer side. Thus, it is adapted that the opening area of the inflow ports 15a and 15b at the near side is larger to allow much fluid to enter into, while the area of the inflow port 15e at the back side is smaller. Owing to this arrangement, the flow rate entering into each inflow port is made approximately uniform.

As shown in FIG. 2, two inflow ports are disposed in a neighboring position so that the inflow ports 15a and 15b at the near side make a pair, and that the inflow ports 15c and 15d at the center make a pair. When the fluid flows out into the heat transfer chamber 10 from one inflow port, it extends in a radial pattern from the inflow port, and therefore, there is a fear that uniform parallel flow may not be formed from the side surface 5d at the intake side of the heat transfer chamber 10 toward the side surface 5c at the outlet side thereof. Accordingly, by disposing a pair of two inflow ports, it is adapted so that flows of the fluid flowing out from these inflow ports collide and interact with each other resulting in a straight flow. Thus, the fluid flowing out from each inflow port flows substantially parallel in the flow path at a uniform speed.

In the outflow ports, it is adapted so that the opening area of the outflow port 17a at the near side is smaller compared to the outflow port 17c at the back side. In the outlet flow path 9, the flow rate of the fluid flowing inside thereof increases toward the near side which is the downstream side thereof, and the density of the fluid is also increased. Therefore, the opening area of the outflow port 17a at the near side is made smaller to reduce the flow rate of the fluid flowing from the outflow port 17a at the near side into the outlet flow path 9, thereby achieving smooth flow of the fluid within the outlet flow path 9.

Simulation analysis of flow of the fluid in the heat transfer chamber 10 has shown that the flow is substantially parallel with a constant speed, and that pressure difference of the fluid is a little between the inflow port and the outflow port. Further, it has been shown that substantially uniform flow is formed even when the flow rate of the fluid guided from the intake flow path is changed.

When the fluid is drained from the heat transfer chambers 10, the fluid remaining in the flow paths or the through holes goes down, and is discharged from the intake flow path 7 or the outlet flow path 9. Since the flow path lies only in the up/down direction and the right/left direction, the fluid can be removed substantially completely with leaving little fluid in the chamber by discharging the fluid. Owing to this, it is possible to prevent contamination by a residual chemical fluid or crystallization therefrom.

In many cases, the fluorocarbon series resin used as the material for the heat transfer block 1 is provided in a shape of rectangular slab. However, according to the first embodiment, the heat transfer block can be manufactured by a simple machining such as carving the block surface for forming concave portions, drilling for forming the intake flow path and the outlet flow path, and drilling for forming inflow ports, outflow ports and through holes. Therefore, even when a material is provided in a shape of slab, it can be processed easily. Accordingly, the manufacturing cost can be reduced.

Next, referring to FIG. 4, a fluid temperature control apparatus according to a second embodiment of the present invention will be described. The fluid temperature control apparatus according to the second embodiment is constituted by modifying the configuration of the heat transfer block 1 of the fluid temperature control apparatus as shown in FIG. 1. The other constitution is the same as that of the fluid temperature control apparatus according to the first embodiment of the present invention.

Figure 4:
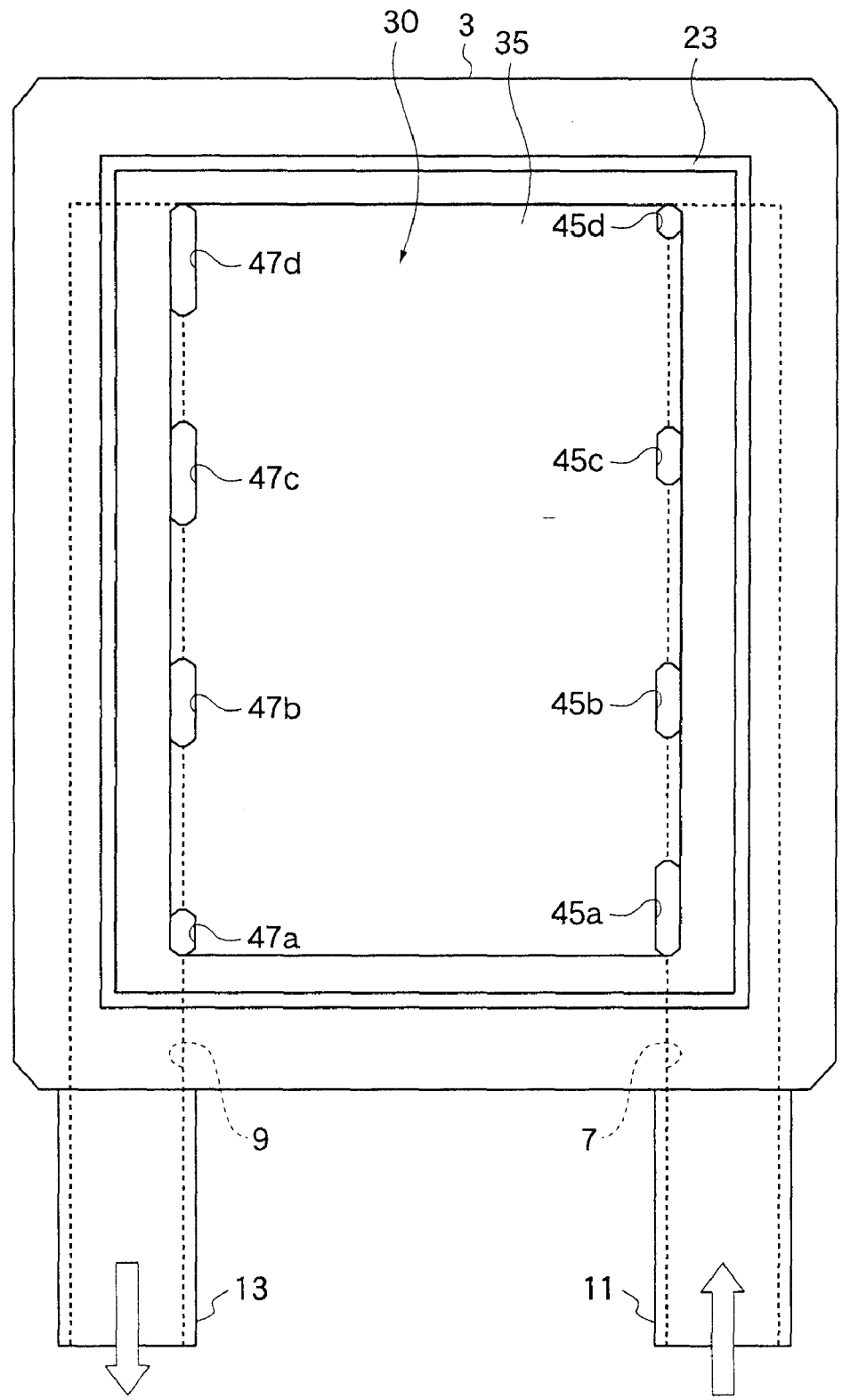
FIG. 4 is a plan view showing a structure of a heat transfer block included in a fluid temperature control apparatus according to a second embodiment of the present invention.

FIG. 4 is a plan view showing structure of a heat transfer block 3 included in the fluid temperature transfer chambers according to the second embodiment. Although a heat transfer chamber 30 constituted by the heat transfer block 3 formed with the concave portions 35 and the heat transfer plate has substantially the same structure as that of the heat transfer chamber 10 shown in FIG. 2, the shape of the concave portion and the position and size of the inflow ports and the outflow ports are different therefrom. The components that have the same structure and function as those of the heat transfer chamber shown in FIG. 2 are given the same reference numerals and the description thereof will be omitted.

In the second embodiment, inflow ports 45a–45d at the intake flow path 7 side are formed at four places, and any of holes do not make a pair. It is adapted so that the opening areas become smaller from the near side toward the back side. Also, the outflow ports 47a–47d at the outlet flow path 9 side are formed at four places, and the opening areas thereof become smaller from the back side toward the near side.

Even when the structure of the heat transfer block is modified as described above, the same effect as the heat transfer chamber shown in FIG. 2 can be obtained.

Next, referring to FIG. 5, a fluid temperature control apparatus according to a third embodiment of the present invention will be described. The fluid temperature control apparatus according to the third embodiment is characterized in a structure of sealing portion between the heat transfer block and the heat transfer plate. Other constitution is the same as that of the fluid temperature control apparatus according to the first or second embodiment of the present invention.

Figure 5:
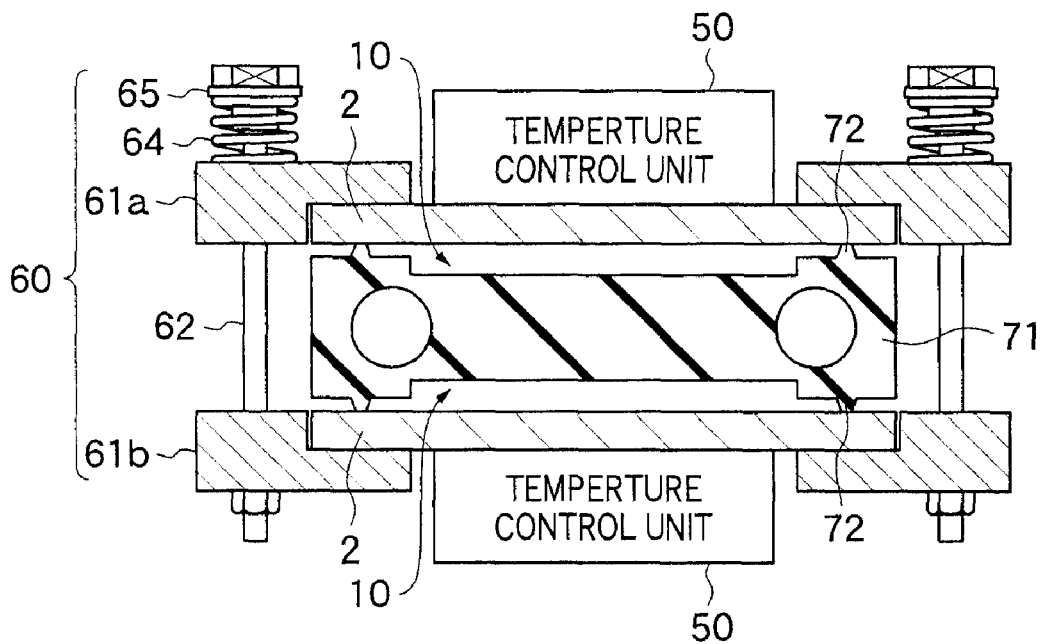
FIG. 5 is a sectional view showing a structure of a fluid temperature control apparatus according to a third embodiment of the present invention.

As shown in FIG. 5, the heat transfer chamber 10 is constituted of a heat transfer block 71 and heat transfer plate 2. In the heat transfer block 71, the regions that come into contact with the heat transfer plates 2 are formed into ring-like convex portions 72 by carving the heat transfer block 71. That is to say, in place of the groove 23 for inserting sealing member as shown in FIG. 2, the convex portions 72 are formed so as to surround the periphery of the heat transfer chambers 10. The sectional configuration of the convex portions 72 is not limited to a trapezoid-shape as shown in FIG. 5, but in addition, various configurations such as a triangle-shape or an arc-shape may be used.

As described above, a fluorocarbon series resin such as Teflon (registered trademark) block is used as the material for the heat transfer block 71. Since such material has a predetermined elasticity, by compressing the heat transfer block 71 and the heat transfer plates 2 by the holding units 60, the convex portions 72 come into tight contact with the heat transfer plates 2, and thereby the liquid-tightness of the heat transfer chambers 10 is maintained. Further, the coil springs 64 of the holding units 60 may be adjusted such that the convex portions 72 undergo plastic deformation a little when the heat transfer block 71 has suffered a thermal expansion. Owing to this, the tight contact of the convex portions 72 at the contacting portions with the heat transfer plates 2 can be increased.

According to the third embodiment, since the heat transfer chamber is sealed by the convex portions integrated with the heat transfer block, mechanical strength and chemical resistance of the sealing portions can be increased resulting in an increased sealing performance. Further, since grooves, where the fluid is apt to remain, are not formed, the chemical fluid hardly remains. Accordingly, it is possible to prevent contamination and crystallization due to residual chemical fluid.

Figure 6:
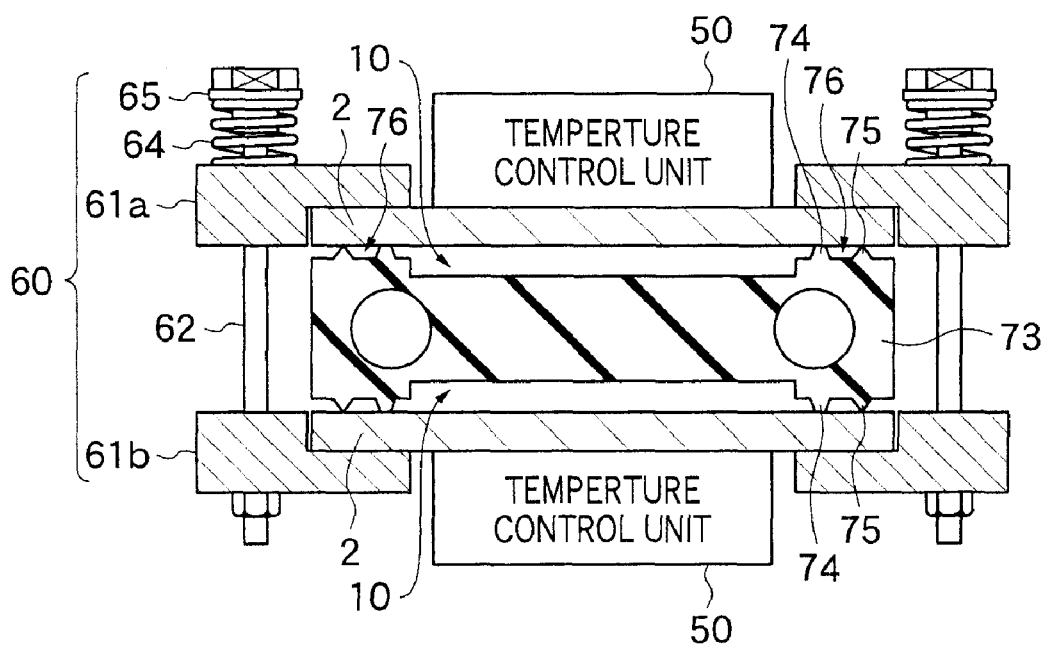
FIG. 6 is a sectional view showing a modification of the fluid temperature control apparatus according to the third embodiment of the present invention.

FIG. 6 shows a modification example of the fluid temperature control apparatus according to the third embodiment. In this modification example, on a heat transfer block 73, convex portions 75 are further provided outer side of convex portions 74 for sealing the heat transfer chambers 10. Owing to this, ring-shape flow paths 76 are formed between the convex portions 74 and the convex portions 75. In a portion of the convex portion 75, an inflow port and an outflow port are formed, and an inert gas such as $N_2$ is flowed as a purge gas in the flow path 76.

While the temperature control apparatus is in operation, a gas may be generated from the chemical fluid that is subjected to the temperature control in the heat transfer chamber 10, and the gas may leak from a sealed portion of the convex portion 74. In this case, the leaked gas can be collected by guiding the purge gas into the flow path 76 via the inflow port, allowing the purge gas to pass through the flow path 76, and guiding the purge gas to go out via the outflow port.

Next, referring to FIGS. 7A–7C, a fluid temperature control apparatus according to a fourth embodiment of the present invention will be described. The fluid temperature control apparatus according to the fourth embodiment is constituted by modifying the configuration of the holding unit of the fluid temperature control apparatus as shown in FIG. 1 or 5. That is to say, the structure of the holding unit in the temperature control apparatus according to the present application is not limited to the embodiment as shown in FIG. 1 or 5 but it is sufficient that the structure holds the heat transfer block and the heat transfer plate by using an elastic force.

Figure 7A:
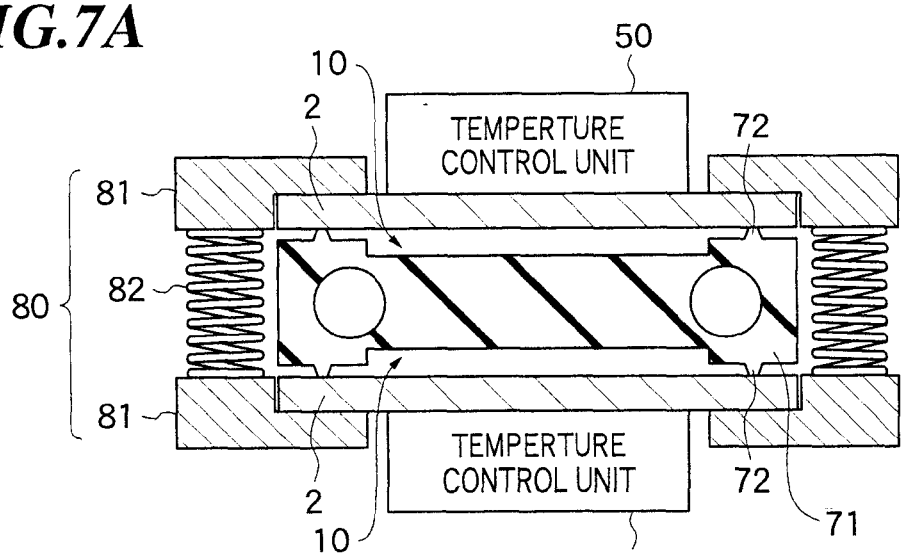
FIGS. 7A–7C are sectional views showing a structure of a fluid temperature control apparatus according to a fourth embodiment of the present invention.

The fluid temperature control apparatus as shown in FIG. 7A comprises holding units 80 including frames 81 for sandwiching a heat transfer block 71 and heat transfer plates 2, which are disposed at both sides of the block, from both sides thereof, and coil springs 82 for fastening the frames 81. By adapting a structure of the holding unit 80 as described above, degree of freedom of the heat transfer block 71 with respect to the thermal deformation can be increased.

Figure 7B:
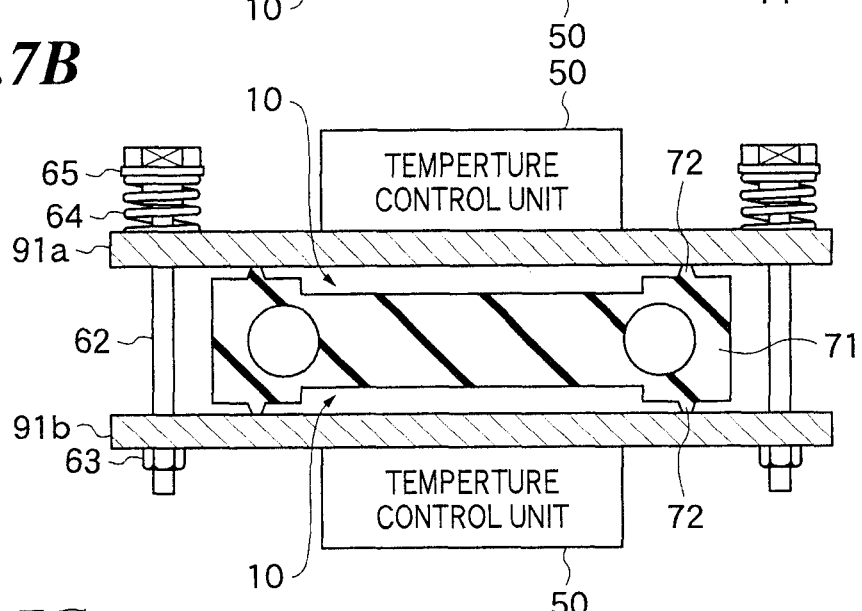

The fluid temperature control apparatus as shown in FIG. 7B has heat transfer plates 91a and 91b, in which the heat transfer plates and the frames for holding them are integrated. By integrating the heat transfer plates with the frames, the structure thereof can be simplified resulting in a reduction of manufacturing cost. Further, since the heat is transferred via bolts 62 between the two heat transfer plates 91a and 91b disposed at the top and the bottom in the figure, it is possible to control the temperature of the fluid effectively in the two heat transfer chambers 10 disposed at the both sides of the heat transfer block 71.

Figure 7C:
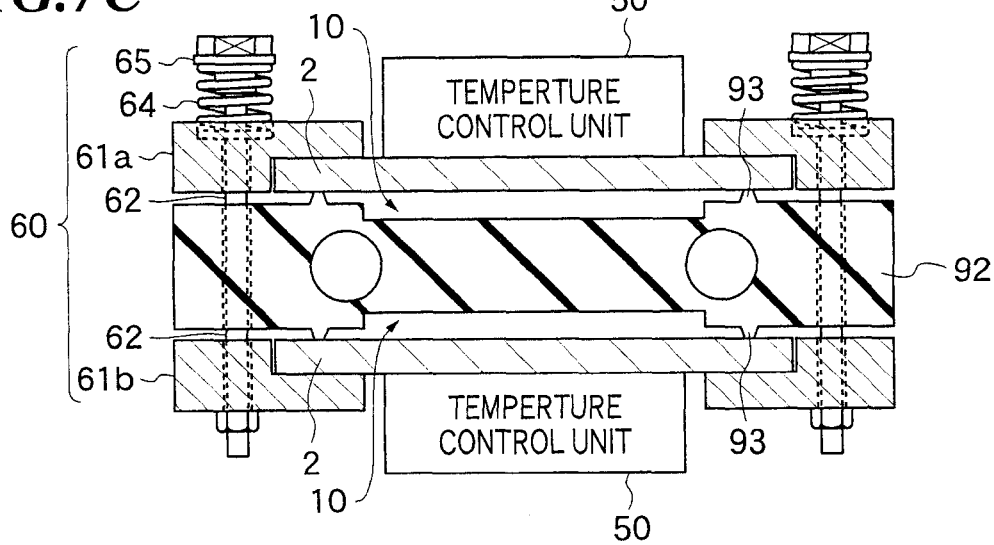
Figure 8:
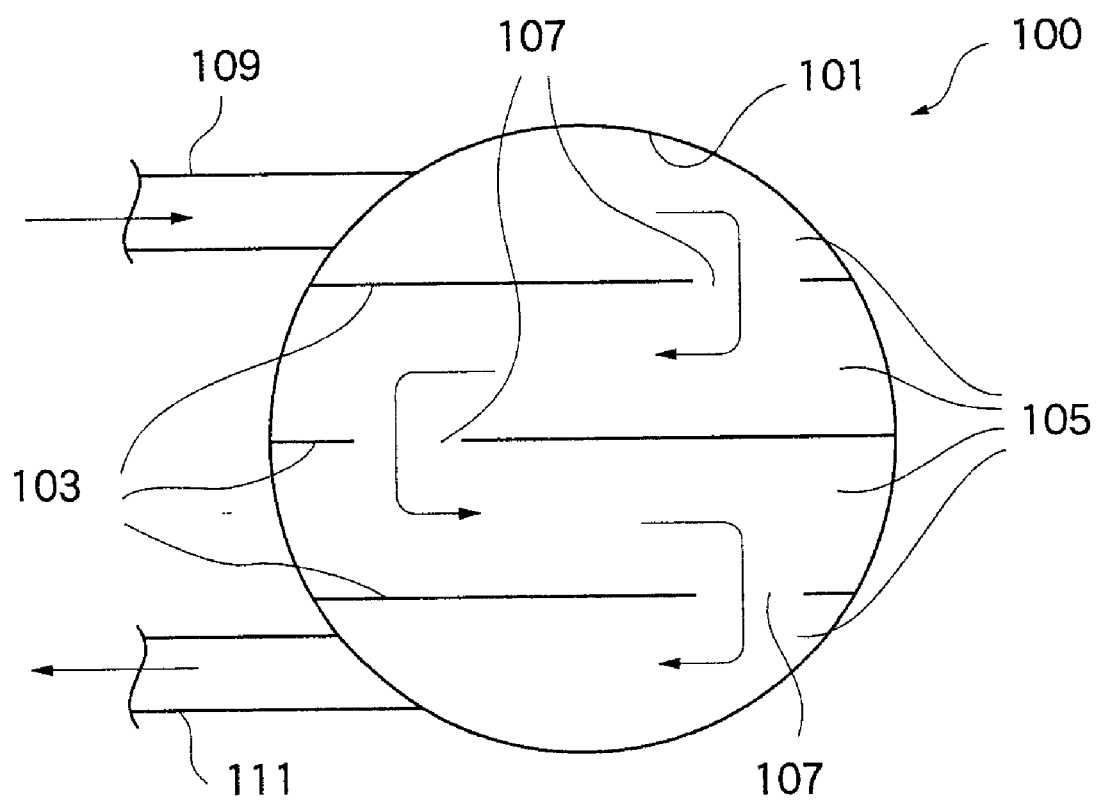
FIG. 8 is a plan view schematically showing a structure of a conventional fluid temperature control apparatus.

Furthermore, as shown in FIG. 7C, the bolts 62 may be disposed so as to go through the heat transfer block 92 in any positions excluding the flow path of the fluid when holding the heat transfer block 92 and the heat transfer plates 2. By adapting so that the bolts go through the heat transfer block 92, it is possible to hold the heat transfer block 92 stably. Still further, by disposing bolts 62 adjacent to the convex portions 93 that is the sealing portions of the heat transfer chambers 10, it is possible to control the force applied to the convex portions 93 precisely by means of the elastic force of the coil springs.

In the above-described embodiments, the positions of the holding units that hold the heat transfer block and the heat transfer plates are not limited to the both sides in figures. For example, in the fluid temperature control apparatus as shown in FIG. 1, the heat transfer block and the heat transfer plates may be held by disposing the holding unit 60 in either one of the right side and the left side in the figure. Owing to this, it is possible to simplify the constitution of the fluid temperature control apparatus.

As described above, according to the present invention, a high sealing performance in the sealing portions can be maintained even under situation of repetitive temperature cycle accompanying cooling and heating. Therefore, the fluid temperature control apparatus can be used stably for long period of time under situation of a large temperature control range. Also, according to the present invention, since the fluid passes through the heat transfer chambers at a uniform speed, it is possible to control the temperature of the fluid precisely. Further, since it is possible to prevent the chemical fluid from remaining within when the chemical fluid is drained from the heat transfer chamber so that the heat transfer chamber is not contaminated. According to the present invention, the structure of the fluid temperature control apparatus is simple, and therefore, the manufacturing method is simple which can reduce the manufacturing cost.

What is claimed is:

1. A fluid temperature control apparatus comprising:
   a block member formed with at least one inflow port and at least one outflow port for fluid, and a concave portion which constitutes a part of a heat transfer chamber for controlling temperature of the fluid by allowing the fluid to pass therethrough;
   a heat transfer plate which constitutes said heat transfer chamber by covering said concave portion of said block member;
   holding means for holding said block member and said heat transfer plate such that contact portions thereof come into tight contact with each other, said holding means holding said block member and said heat transfer plate by using an elastic member so as to prevent plastic deformation of said block member by means of expansion and contraction of said elastic member following thermal expansion and thermal contraction of said block member respectively; and
   temperature controlling means for performing heat exchange with the fluid, which passes through said heat transfer chamber, via said heat transfer plate.

2. The fluid temperature control apparatus according to claim 1, wherein said holding means includes a coil spring.

3. The fluid temperature control apparatus according to claim 1, wherein said block member is made of a corrosion resistant material.

4. The fluid temperature control apparatus according to claim 3, wherein said block member is made of a material including fluorocarbon series resin.

5. The fluid temperature control apparatus according to claim 1, wherein said concave portion formed in said block member has a bottom surface and opposite two side surfaces, and said at least one inflow port is formed in said bottom surface along one of said opposite two side surfaces and said at least one outflow port is formed in said bottom surface along the other of said opposite two side surfaces.

6. The fluid temperature control apparatus according to claim 5, wherein an intake flow path and an outlet flow path for fluid are formed in said block member along said opposite two side surfaces of said concave portion, respectively.

7. The fluid temperature control apparatus according to claim 6, wherein said at least one inflow port is formed so as to connect said concave portion and said intake flow path formed in said block member to each other, and said at least one outflow port is formed so as to connect said concave portion and said outlet flow path formed in said block member to each other.

8. The fluid temperature control apparatus according to claim 7, wherein plural inflow ports are formed in said block member so as to become smaller in diameter toward downstream of said intake flow path.

9. The fluid temperature control apparatus according to claim 1, wherein said temperature controlling means includes a thermoelectric exchange module having plural thermoelectric elements.

* * * * *